(12) United States Patent
Yang et al.

(10) Patent No.: US 8,385,101 B2
(45) Date of Patent: Feb. 26, 2013

(54) MEMORY RESISTOR HAVING PLURAL DIFFERENT ACTIVE MATERIALS

(75) Inventors: Jianhua Yang, Palo Alto, CA (US); Minxian Max Zhang, Mountain View, CA (US); R. Stanley Williams, Portola Valley, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 363 days.

(21) Appl. No.: 12/847,874

(22) Filed: Jul. 30, 2010

(65) Prior Publication Data
US 2012/0026776 A1 Feb. 2, 2012

(51) Int. Cl.
*G11C 11/00* (2006.01)

(52) U.S. Cl. .......... 365/148; 365/158; 365/100

(58) Field of Classification Search .......... 365/148, 365/158, 100
See application file for complete search history.

(56) References Cited

U.S. PATENT DOCUMENTS

| | | | |
|---|---|---|---|
| 7,145,824 B2 | 12/2006 | Bill et al. | |
| 7,719,001 B2 | 5/2010 | Nomura et al. | |
| 7,719,875 B2 | 5/2010 | Toda et al. | |
| 7,719,876 B2 * | 5/2010 | Chevallier et al. | 365/148 |
| 7,767,993 B2 | 8/2010 | Toda et al. | |
| 7,995,371 B2 * | 8/2011 | Rinerson et al. | 365/148 |
| 2007/0133358 A1 | 6/2007 | Kubo et al. | |
| 2008/0296561 A1 | 12/2008 | Nomura et al. | |
| 2011/0291067 A1 * | 12/2011 | Brewer et al. | 257/4 |

FOREIGN PATENT DOCUMENTS

| | | |
|---|---|---|
| WO | 2010074685 | 1/2010 |
| WO | 2010074689 | 1/2010 |
| WO | 2010062127 | 3/2010 |
| WO | 2010053713 | 5/2010 |
| WO | 2010085241 | 7/2010 |
| WO | 2010077221 | 8/2010 |

* cited by examiner

*Primary Examiner* — Connie Yoha
(74) *Attorney, Agent, or Firm* — Scott K. Gallert (57) ABSTRACT

Methods and means related to memory resistors are provided. A memristor includes at least two different active materials disposed between a pair of electrodes. The active materials are selected to exhibit respective and opposite changes in electrical resistance in response to changes in oxygen ion content. The active materials are subject to oxygen ion reconfiguration under the influence of an applied electric field. An electrical resistance of the memristor is thus adjustable by way of applied programming voltages and is non-volatile between programming events.

17 Claims, 4 Drawing Sheets

MEMORY RESISTOR HAVING PLURAL DIFFERENT ACTIVE MATERIALS

STATEMENT OF GOVERNMENT INTEREST

This invention has been made with government support. The government has certain rights in the invention.

BACKGROUND

Memory resistors or "memristors" are electronic constructs that exhibit an adjustable, non-volatile electrical resistance. This behavior makes memristors suitable for storage of digital and analog values, instrumentation, switching, and numerous other applications. New types of memristors are sought after by virtue of their new or distinct operating characteristics. The present teachings address the foregoing concerns.

BRIEF DESCRIPTION OF THE DRAWINGS

The present embodiments will now be described, by way of example, with reference to the accompanying drawings, in which.

DETAILED DESCRIPTION

Introduction

Methods and means related to memory resistors are provided. A memristor includes at least two different active materials disposed between a pair of electrodes. The active materials can form respective layers or be combined in an aggregate material. The active materials are subject to oxygen ion reconfiguration under the influence of an applied electric field. An electrical resistance of the memristor is therefore adjustable, over a range, by way of applied programming voltages and is non-volatile between programming events.

In one embodiment, an apparatus includes a memristor. The memristor includes a first electrode and a second electrode spaced apart from the first electrode. The memristor also includes at least two distinct active materials disposed between the first and second electrodes. Each of the active materials is characterized by a respective change in electrical resistance in response to a change in oxygen ion content. The memristor is characterized by a non-volatile electrical resistance that is adjustable by way of programming voltages.

In another embodiment, a memristor includes a first electrode and a second electrode. The memristor also includes a first material including oxygen ions disposed between the first and second electrodes. The first material is characterized by decreasing electrical resistance with decreasing oxygen ion content. The memristor also includes a second material including oxygen ions disposed between the first and second electrodes. The second material is characterized by decreasing electrical resistance with increasing oxygen ion content. The memristor is characterized by a non-volatile electrical resistance that is adjustable over a range by way of programming voltages applied across the first and second electrodes.

In yet another embodiment, a method includes operating a memristor characterized by at least two active materials disposed between a first electrode and a second electrode. The at least two active materials characterized by respectively different electrical resistance changes in response to changes in oxygen ion content. The method also includes applying a programming voltage to the first and second electrodes so as to change a non-volatile electrical resistance of the memristor from a first value to a second value distinct from the first value. The method further includes operating the memristor at the second non-volatile electrical resistance value.

First Illustrative Embodiment

Figure 1:
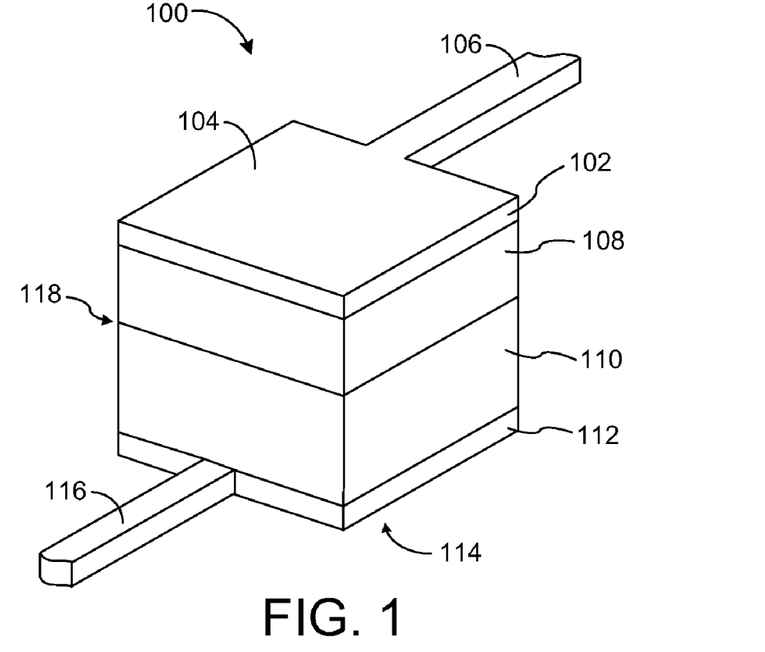
FIG. 1 depicts an isometric view of a memory resistor according to one embodiment.

Reference is now directed to FIG. 1, which depicts an isometric view of a memristor 100. The memristor 100 is illustrative and non-limiting with respect to the present teachings. Thus, other memristors can be configured, constructed or operated in accordance with the present teachings.

The memristor 100 includes an electrode or high-conductivity (conductor) layer 102. The electrode 102 can be formed from or include any suitable electrically conductive material. Non-limiting examples of the electrode 102 material include copper, aluminum, silver, gold, platinum, palladium, titanium nitride (TiN), tantalum nitride, hafnium nitride, ruthenium oxide, etc. Other suitable materials can also be used. The electrode 102 is configured to define a memristor end area 104 and an electrically conductive pathway 106.

The pathway 106 is configured to electrically couple the memristor 100 with another entity or entities such as another memristor, electronic circuitry, a controller, a data or signal buss, etc. The pathway 106 extends away from the memristor 100 in an illustrative direction. However, it is to be understood that the pathway 106 can lead away from the memristor 100 along any suitable direction and may be linear, curved, serpentine, and so on, in shape.

The memristor 100 also includes a first material 108. The first material 108 is also referred to as a "first layer" or "first active material" 108. The first material 108 can be defined by titanium dioxide ($TiO_2$) or another titanium oxide (e.g., $TiO_x$ or $TiO_{2-x}$). Alternatively, the first material 108 can be defined by manganese monoxide (MnO) or another manganese oxide (e.g., $MnO_x$ or $MnO_{2-x}$). Other suitable materials can also be used.

The memristor 100 also includes a second material 110. The second material 110 is also referred to as a "second layer" or "second active material" 110. The second material 110 can be defined by manganese monoxide (MnO) or another manganese oxide (e.g., $MnO_x$ or $MnO_{2-x}$). Alternatively, the second material 110 can be defined by titanium dioxide ($TiO_2$) or another titanium oxide (e.g., $TiO_x$ or $TiO_{2-x}$). Other suitable materials can also be used.

In one embodiment, the first material 108 is defined by or includes $TiO_x$ and the second material 110 is defined by or includes $MnO_x$. In an alternative embodiment, the first and second materials 108 and 110 are defined vice-versa. In this way, the present teachings contemplate any number of embodiments having layer-wise constructs of alternating material types. The first material 108 and the second material 110 are in contact with each other at an interface 118.

The memristor 100 further includes an electrode or high-conductivity (conductor) layer 112. The electrode 112 can be formed from or include any suitable electrically conductive material. Non-limiting examples of the electrode 112 include copper, aluminum, silver, gold, platinum, palladium, titanium nitride (TiN), hafnium nitride, tantalum nitride, ruthenium oxide, etc. Other suitable materials can also be used. The electrode 112 is configured to define a memristor end area 114 and an electrically conductive pathway (pathway) 116.

The pathway 116 is configured to electrically couple the memristor 100 with another entity or entities such as another memristor, electronic circuitry, a controller, a data or signal buss, etc. The pathway 116 extends away from the memristor 100 in an illustrative direction. However, it is to be understood that the pathway 116 can lead away from the memristor 100 along any suitable direction and may be linear, curved, serpentine, and so on, in shape.

It is noted that the memristor 100 is defined by a generally square or rectangular cross-sectional shape. How, it is to be understood that other embodiments respectively defined by other cross-sectional shapes or form-factors can also be used. Non-limiting examples of such forms include elliptical, circular, triangular, hexagonal, etc. Furthermore, other memristors (not shown) can be formed and operated according to the present teachings that have respectively varying longitudinal cross-sectional areas (e.g., hourglass, ellipsoid, etc.).

The first material 108 and the second material 110 respectively include oxygen ions and oxygen vacancies that are repositionable or migratable under the influence of an electric field. For non-limiting example, it has been found that the electrical resistance of titanium oxide decreases with decreasing oxygen (ion) content, while the electrical resistance of manganese oxide decreases with increasing oxygen (ion) content.

Therefore, both the TiOx layer and the MnOx layer become more resistive simultaneously under one voltage polarity and both of them become more conductive simultaneously under the opposite voltage polarity, leading to a large ON and OFF conductance ratio. In this structure, oxygen ions are accommodated inside the TiOx/MnOx bilayer during switching operation and no oxygen gas is released from the device, which improve device endurance. In addition, some new switching behavior can be realized, which does not utilize the interface resistance change for switching, but utilize the bulk resistance change.

It is further noted that the interface 118 is generally permeable to mobile dopants such as oxygen ions or oxygen vacancies. Oxygen ions or vacancies can be driven across the interface 118 such that a distribution or "profile" within the first and second materials 108 and 110 is defined. These mobile dopants can be controllably bi-directionally migrated between the first and second materials 108 and 110 under the influence of an electric field (i.e., programming voltage, etc.). In this way, the oxygen/vacancy profile and thus the overall electrical resistance of the memristor 100 can be reconfigured during normal operations.

Table 1 below includes illustrative and non-limiting characteristics for an embodiment of memristor 100. Other memristors having respectively varying dimensions, characteristics or constituencies are also contemplated by the present teachings. It is noted that within Table 1, "μm" equals $1 \times 10^{-6}$ meters and "nm" equals $1 \times 10^{-9}$ meters.

TABLE 1

| Illustrative Memristor 100 | | |
| --- | --- | --- |
| Feature | Length × Width × Thickness | Notes |
| Electrode 102 | 0.1 μm × 0.1 μm × 0.5 μm | Platinum |
| Material 108 | 0.1 μm × 0.1 μm × 10.0 nm | $TiO_2$ |
| Material 110 | 0.1 μm × 0.1 μm × 10.0 nm | MnO |
| Electrode 112 | 0.1 μm × 0.1 μm × 0.5 μm | Platinum |

Second Illustrative Embodiment

Figure 2:
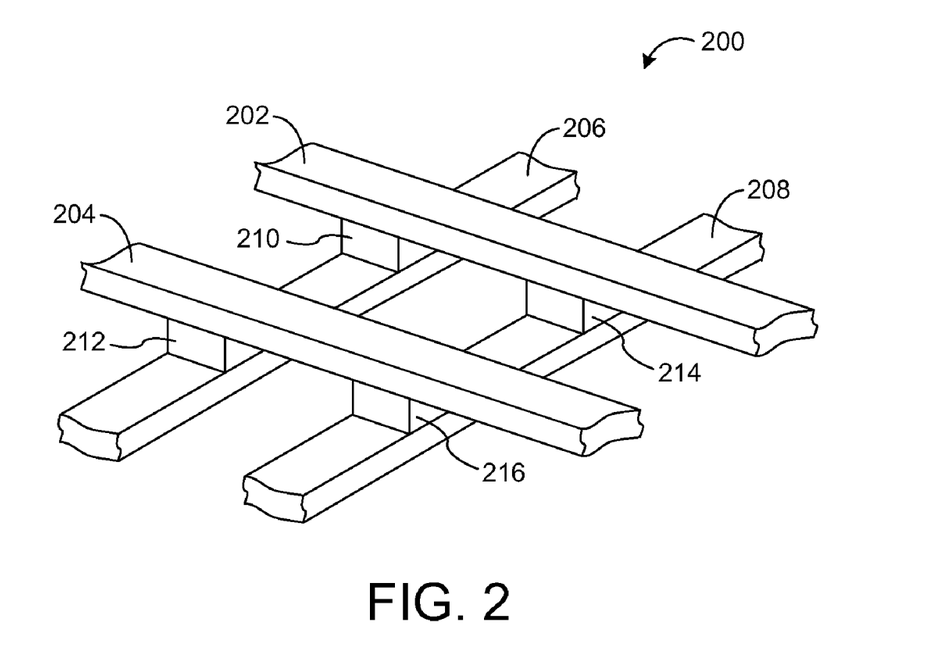
FIG. 2 depicts an isometric view of a memory resistor array according to one embodiment.

Attention is now directed to FIG. 2, which depicts an isometric view of a two-by-two array 200. The array 200 is illustrative and non-limiting with respect to the present teachings. Thus, other arrays and networks can be configured, constructed or operated in accordance with the present teachings.

The array 200 includes a first crossbar 202, a second crossbar 204, a third crossbar 206 and a fourth crossbar 208. Each of the respective crossbars 202-208, inclusive, can be formed from or include any suitable electrically conductive material such as, for non-limiting example, copper, aluminum, silver, gold, platinum, palladium, hafnium nitride, titanium nitride (TiN), tantalum nitride, ruthenium oxide, etc. Other suitable materials can also be used.

The crossbars 202 and 204 are disposed in spaced parallel adjacency. In turn, the crossbars 206 and 208 are disposed in spaced parallel adjacency and are generally perpendicular to the crossbars 202 and 204. Additionally, the crossbars 202 and 204 generally overlie and are spaced apart from the crossbars 206 and 208 such that an elevational offset is also defined. Overlying proximity or "cross-over" between any two crossbars is referred to as an "intersection" for purposes herein.

The array 200 is also defined by four memristors located at four respective intersections of the crossbars. Specifically, a first memristor 210 is present at an intersection defined by the crossbars 202 and 206. A second memristor 212 is located at an intersection defined by crossbars 204 and 206. A third memristor 214 is located at an intersection defined by crossbars 202 and 208. Furthermore, a fourth memristor 216 is located at an intersection defined by crossbars 204 and 208.

Each of the respective memristors 210, 212, 214 and 216 can be defined by any suitable embodiment according to the present teachings. For example, any one or more or all of the memristors 210-216 can be substantially defined as described above in regard to the memristor 100. Other memristor embodiments as described hereinafter can also be used.

The array 200 depicts a total of four memristors 210-216 that can be individually accessed (i.e., programmed or read) by way of the corresponding crossbars 202-208. For non-limiting example, the memristor 214 can be adjusted from a first non-volatile resistance value to another non-volatile resistance value by way of an appropriate programming voltage applied across the crossbars 202 and 208. It should be apparent to one of ordinary skill in the electrical arts that other arrays having any suitable number of individually accessible memristors can also be defined and used. Thus, the size of a (crossbar) array can be one-thousand by one-thousand or even larger, depending on the embodiment, applications, associated circuit design, etc.

Third Illustrative Embodiment

Figure 3:
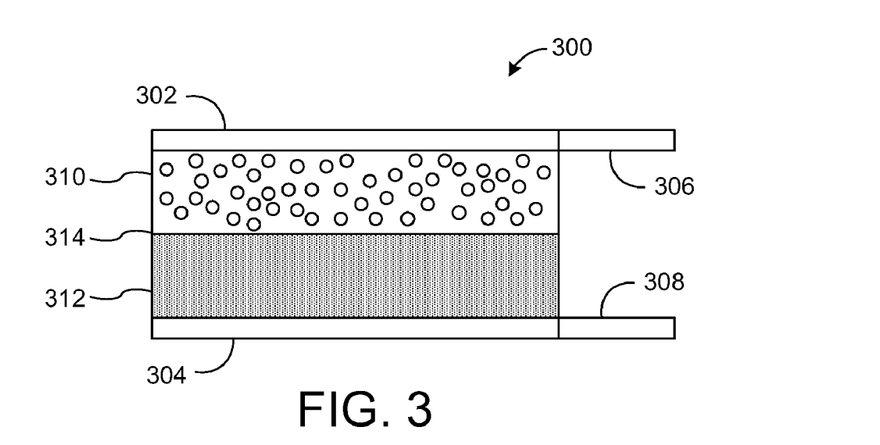
FIG. 3 is an elevation view of a memory resistor according to another embodiment.

FIG. 3 depicts an elevation view of a memristor device 300 according to another embodiment. The memristor 300 is illustrative and non-limiting. Other embodiments can also be defined, configured and used according to the present teachings.

The memristor 300 includes an upper or first electrode 302 and a lower or second electrode 304. The respective electrodes 302 and 304 are formed from or include any suitable electrically conductive material. In one embodiment, the electrodes 302 and 304 are formed from platinum. Other materials can also be used. The electrodes 302 and 304 include electrically conductive pathways 306 and 308, respectively, such that the memristor 300 can be electrically coupled to another entity or circuitry.

The memristor 300 also includes a first active material 310. The active material 310 is also referred to as a first layer or first material 310. The first material 310 is formed from a suitable oxide having oxygen ions that are repositionable under the influence of an electric field. In one embodiment, the first material 310 is defined by manganese oxide (i.e., MnOx). Other suitable materials can also be used.

The memristor 300 further includes a second active material 312. The active material 312 is also referred to as a second layer or second material 312. The second material 312 is formed from a suitable oxide having oxygen ions that are repositionable under the influence of an electric field. In one embodiment, the second material 312 is defined by titanium oxide (i.e., TiOx). Other suitable materials can also be used.

The memristor 300 is also characterized by an interface 314 defined by the contact area of the first material 310 with the second material 312. Oxygen ions and vacancies can readily migrate across the interface 314 by virtue of a programming voltage applied across the electrodes 302 and 304. Direction and rate of oxygen or vacancy migration are controllable by way of programming voltage magnitude, polarity and time (i.e., electrical pulse length).

The overall electrical resistance of the memristor 300 can be selectively adjusted over a range by way of applied direct-current (DC) programming voltages. The electrical resistance is non-volatile or nearly so in the absence of a programming voltage. The present resistance value of the memristor 300 can then be read or sensed by way of a lesser sense current or voltage applied to the electrodes 302 and 304. The sense current or voltage is small enough not to disturb the resistance states of the device.

The memristor 300 is illustrative of any number of embodiments that include different active materials (i.e., 310 and 312) arranged as respective layers between the electrodes 302 and 304. Form-factor and dimensions of the respective features or elements of the memristor 300 can be varied. In one embodiment, the memristor 300 is defined by respective width, length and thickness dimensions about the same as those described above in Table 1.

Fourth Illustrative Embodiment

Figure 4:
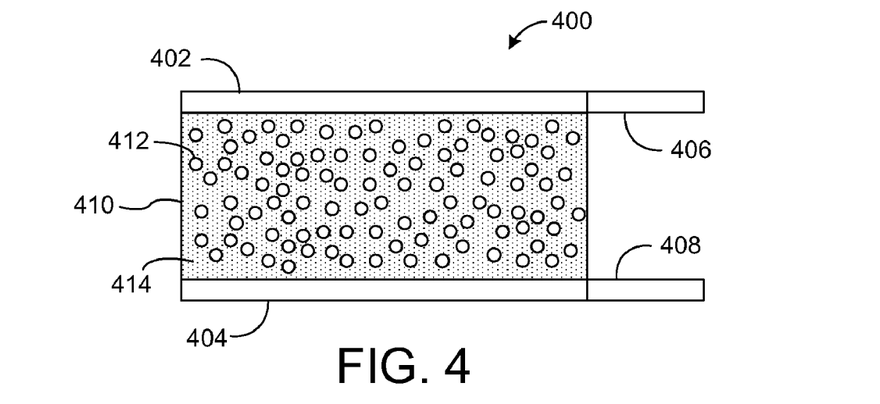
FIG. 4 is an elevation view of a memory resistor according to yet another embodiment.

FIG. 4 depicts an elevation view of a memristor device 400 according to another embodiment. The memristor 400 is illustrative and non-limiting. Other embodiments can also be defined, configured and used according to the present teachings.

The memristor 400 includes a first electrode 402 and a second electrode 404. The respective electrodes 402 and 404 are formed from or include any suitable electrically conductive material. In one embodiment, the electrodes 402 and 404 are formed from platinum. Other materials can also be used. The electrodes 402 and 404 are defined by or include electrically conductive pathways 406 and 408, respectively.

The memristor 400 also includes an aggregate or granular layer of material 410. The granular material 410 includes two different active materials or oxygen-bearing materials 412 and 414, respectively. In one embodiment, the granular material includes manganese oxide (MnOx) 412 and titanium oxide (TiOx) 414. Other combinations of two or more active materials can also be used. The granular material 410 is formed such that the two distinct compounds of materials 412 and 414 are distributed generally uniformly throughout. The two distinct materials are selected so that the electrical resistance of one material decreases with decreasing oxygen (ion) content, while the electrical resistance of the other decreases with increasing oxygen (ion) content.

It is to be noted that varying ratios of the two (or more) active materials can be used. In one embodiment, the granular material 410 includes about fifty percent TiOx and about fifty percent MnOx by mass. In another embodiment, the ratio can be sixty/forty, etc. Additionally, a granular material (not shown) can be defined including three or more active materials.

The memristor 400 is characterized such that DC programming voltages applied across the electrodes 402 and 404 will cause a migration of oxygen ions from one active material (e.g., 412) to another active material (e.g., 414). This migration is reversible by way of other programming voltages of opposite polarity. Direction and rate of oxygen or vacancy migration are controllable by way of programming voltage magnitude, polarity and pulse length. In the memristor 400, the migration may occur over a relatively short distance since one material is dispersed inside the other.

In this way, the overall electrical resistance of the memristor 400 can be selectively adjusted over a range by way of applied direct-current (DC) programming voltages. The electrical resistance is non-volatile or nearly so in the absence of a programming voltage. The present resistance value of the memristor 400 can then be read or sensed by way of a lesser sense current or voltage applied to the electrodes 402 and 404.

The memristor 400 is illustrative of any number of embodiments that include different active materials (i.e., 412 and 414) included within the aggregate or granular layer 410. Dimensions of the respective features or elements of the memristor 400 can be varied. In one embodiment, the memristor 400 is defined by respective width, length and thickness dimensions analogous to those described above in Table 1.

Fifth Illustrative Embodiment

Figure 5:
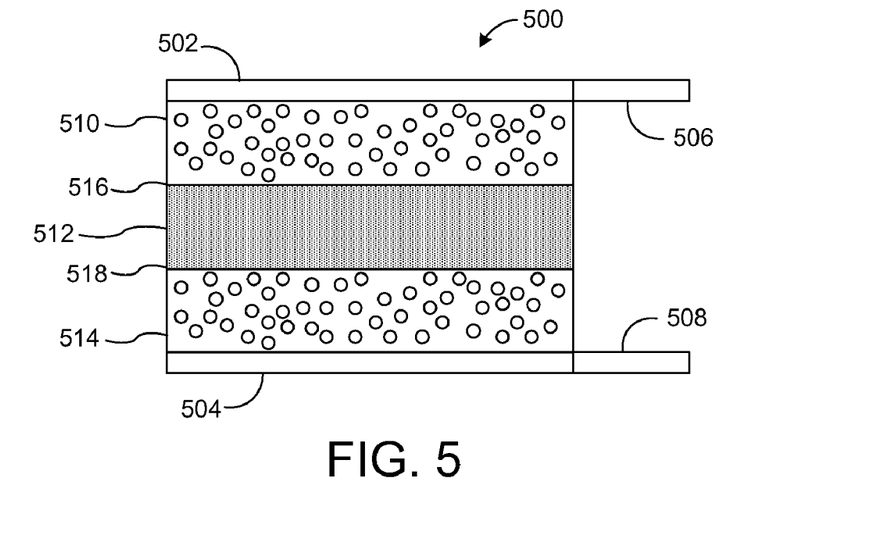
FIG. 5 is an elevation view of a memory resistor according to still another embodiment.

Attention is now directed to FIG. 5, which depicts an elevation view of a memristor device 500 according to yet another embodiment. The memristor 500 is illustrative and non-limiting. Other embodiments can also be defined, configured and used according to the present teachings.

The memristor 500 includes a first electrode 502 and a second electrode 504. The respective electrodes 502 and 504 are formed from, or include, any suitable electrically conductive material. In one embodiment, the electrodes 502 and 504 are formed from platinum. Other materials can also be used. The electrodes 502 and 504 are defined by or include electrically conductive pathways 506 and 508, respectively.

The memristor 500 also includes a first active material 510. The active material 510 is also referred to as a first layer or first material 510. In one embodiment, the first material 510 is defined by manganese oxide (i.e., MnOx). Other suitable materials can also be used.

The memristor 500 also includes a second active material 512. The active material 512 is also referred to as a second layer or second material 512. In one embodiment, the second material 512 is defined by titanium oxide (i.e., TiOx). Other suitable materials can also be used.

The memristor 500 also includes a third active material 514. The active material 514 is also referred to as a third layer or third material 514. In one embodiment, the third material 514 is defined by manganese oxide (i.e., MnOx). Other suitable materials can also be used. The active materials are selected so that the electrical resistance of at least one material decreases with decreasing oxygen (ion) content, while the electrical resistance of at least one another material decreases with increasing Oxygen (ion) content.

The memristor 500 is also characterized by an interface 516 defined by the contact area of the first material 510 with the second material 512. The memristor 500 is further characterized by an interface 518 defined by the contact area of the second material 512 with the third material 514.

Oxygen ions and vacancies can readily migrate across the respective interfaces 516 and 518 under the influence of a programming voltage applied across the electrodes 502 and 504. Direction and rate of oxygen or vacancy migration are controllable by way of programming voltage magnitude, polarity and pulse length.

The overall electrical resistance of the memristor 500 can be selectively adjusted over a range by way of DC programming voltages applied across the electrodes 502 and 504. The electrical resistance is non-volatile or nearly so. The present resistance value of the memristor 500 can then be read or sensed by way of a lesser sense current or voltage.

The memristor 500 is illustrative of any number of embodiments that include two (or more) different active materials arranged as three (or more) respective layers between the electrodes. Active material species alternate in such a layer-wise configuration so that different material types are in contacting adjacency (or interfaced) with each other.

Dimensions of the respective features or elements of the memristor 500 can be varied. In one embodiment, the memristor 500 is defined by respective width, length and thickness dimensions about the same as those described above in Table 1.

First Illustrative Device

Figure 6:
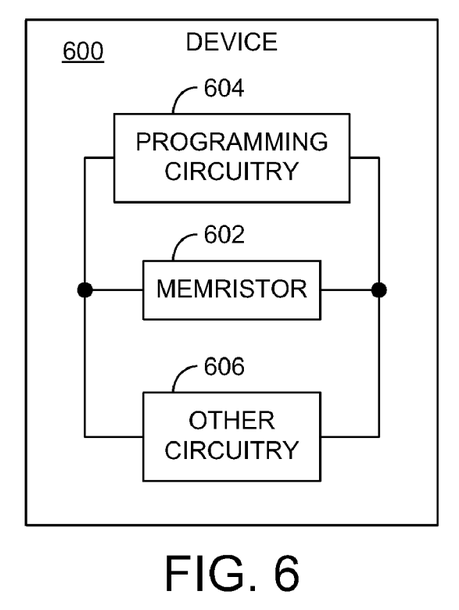
FIG. 6 depicts a block diagram of a device according to one embodiment.

Reference is now made to FIG. 6, which depicts a block diagram of a device 600 according to another embodiment of the present teachings. The device 600 is illustrative and non-limiting in nature. Thus, other devices, circuits and systems are contemplated that include one or more aspects of the present teachings.

The device 600 includes a memristor 602 as introduced above. The memristor 602 can be defined by any embodiment consistent with the present teachings. In one embodiment, the memristor 602 is materially and operationally equivalent to the memristor 100 as described above. Other embodiments can also be used.

The device 600 also includes programming circuitry 604. The programming (or control) circuitry 604 is electrically coupled to the memristor 602 and is configured to apply various DC programming voltages thereto. Such programming voltages can vary respectively in magnitude, duration, or polarity of application. The programming circuitry 604 is thus configured to cause controlled changes in the electrical resistance of the memristor 602. The programming circuitry 604 can be defined by or include any suitable components or configuration such as, but not limited to, a microprocessor, a microcontroller, digital circuitry, analog circuitry, a state machine, etc.

The programming circuitry 604 can also be configured to sense or read the present, non-volatile resistance value of the memristor 602 by applying an AC sensing current thereto and determining the corresponding voltage drop. In such an embodiment, the programming circuitry 604 can also be configured to provide an analog or digital signal corresponding to the sensed resistance value.

The device 600 further includes other circuitry 606 that is electrically coupled to (or includes) the memristor 602. The other circuitry 606 can be defined by any suitable circuitry configured to perform one or more normal operations that use the memristor 602. Non-limiting examples of such operations include cellular communication, environmental sensing, instrumentation and control, radio communication, signal or data storage and retrieval, etc. Thus, the device 600 can be generally defined by any one or more suitable areas of application (e.g., a cellular telephone, a data or signal router, etc.). The other circuitry 606 can be configured to communicate with or control, at least in part, operations of the programming circuitry 604.

First Illustrative Method

Figure 7:
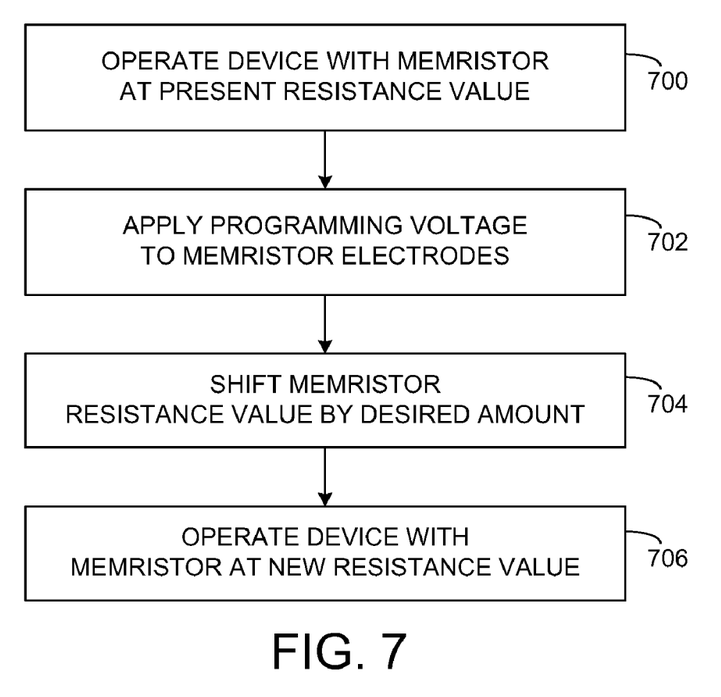
FIG. 7 is a flow diagram depicting a method according to one embodiment.

Attention is now directed to FIG. 7, which depicts a method according to one embodiment of the present teachings. The method of FIG. 7 depicts particular method steps and an order of execution. However, it is to be understood that other methods including other steps, omitting one or more of the depicted steps, or proceeding in other orders of execution are also contemplated. Thus, the method of FIG. 7 is illustrative and non-limiting with respect to the present teachings. Reference is made to FIG. 6 in the interest of understanding the method of FIG. 7.

At 700, a device including a memristor is operated at a present electrical resistance value for the memristor. For purposes of non-limiting illustration, it is assumed that a device 600 includes a memristor 602. The memristor 602 is characterized by a present non-volatile electrical resistance of two-hundred Kilo-Ohms. Other circuitry 606 of the device 600 is electrically coupled to (or includes) the memristor 602 and operates normally according to the present, non-volatile electrical resistance value.

At 702, a programming voltage is applied to the electrodes of the memristor. For purposes of the present illustration, it is assumed that programming circuitry 604 of the device 600 is used to apply a programming potential across the memristor 602. Such a programming voltage (i.e., pulse or signal) can be defined, for example, by one-point-five volts direct-current applied for one microsecond.

At 704, the electrical resistance value of the memristor is adjusted by a desired amount in response to the applied programming voltage. For purposes of the present illustration, it is assumed that the electrical resistance of the memristor 602 is increased by twenty Kilo-Ohms. The result is an overall electrical resistance of two-hundred twenty Kilo-Ohms for the memristor 602. Application of the programming voltage is now stopped.

At 706, the device is operated normally with the memristor at the new electrical resistance value. For purposes of the present illustration, it is assumed that the other circuitry 606 operates normally in accordance with the new, non-volatile electrical resistance value established at 704 above.

Second Illustrative Device

Figure 8:
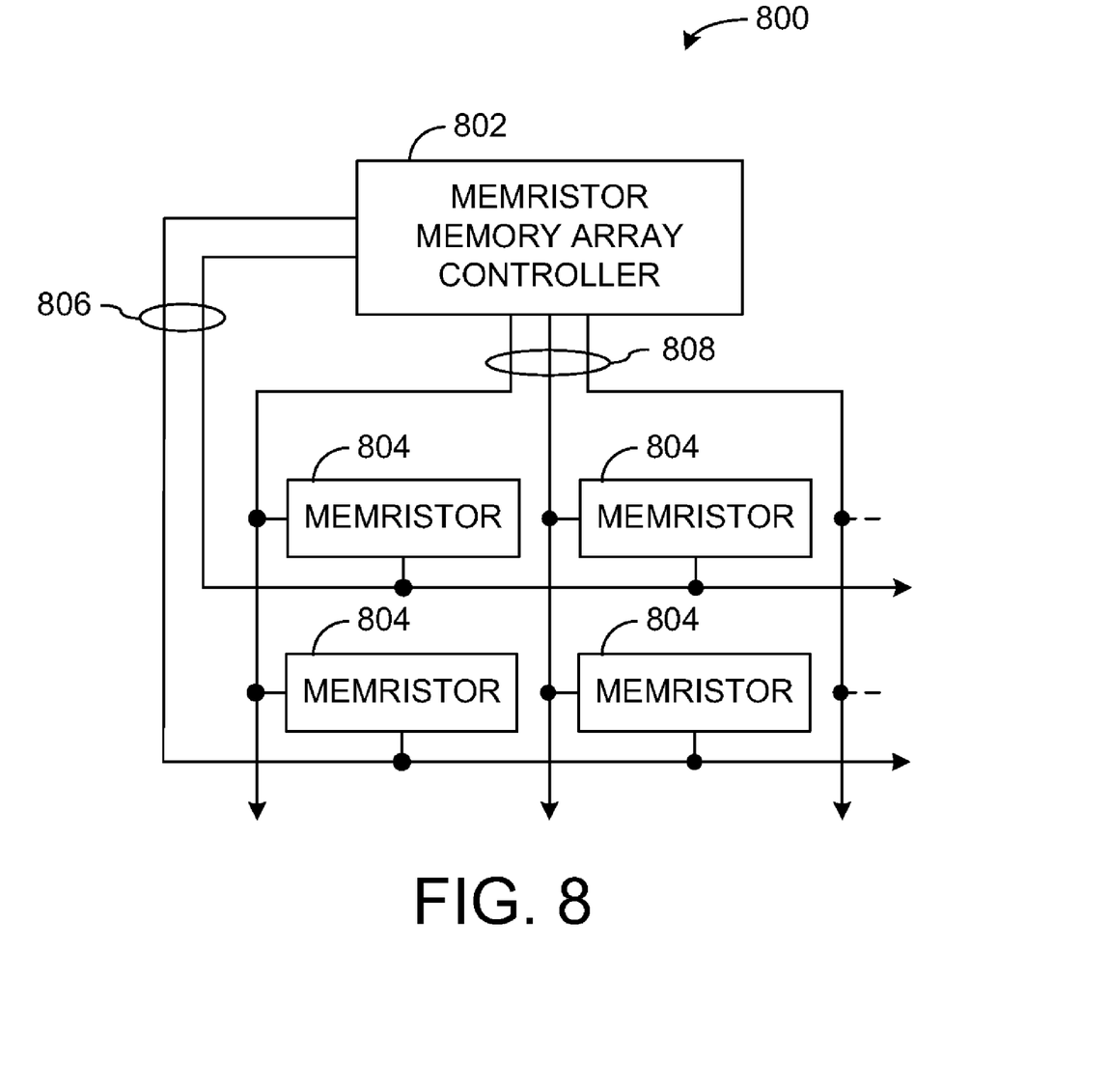
FIG. 8 depicts a block diagram of a device according to another embodiment.

Reference is now made to FIG. 8, which depicts a block diagram of a device 800 according to another embodiment of the present teachings. The device 800 is illustrative and non-limiting in nature. Thus, other devices, circuits and systems are contemplated that include one or more aspects of the present teachings.

The device 800 includes a memristor memory array controller (controller) 802. The controller 802 is configured to address individual memristors 804 of the device 800. Such addressing is performed by way of row control lines 806 and column control lines 808. The controller 802 is also configured to apply programming voltages to the memristors 804 by way of the controls lines 806 and 808.

The device 800 further includes a plurality of memristors 804. Each memristor 804 is defined, configured and operative in accordance with the present teachings. In one embodiment, one or more of the memristors 804 is/are materially and operationally equivalent to the memristor 100 described above. In another embodiment, one or more of the memristors 804 is/are equivalent to the memristor 400 described above. Other embodiments can also be used.

The memristors 804 are arranged as an X-by-Y array, with each memristor 804 being individually addressable and programmable by the controller 802. Each memristor 804 can be operated as a storage cell representing a digital bit, an analog signal level, etc. FIG. 8 depicts a total of four memristors 804 arranged as an array. However, it is to be understood that other arrays including any suitable number of matched or different memristors can also be defined and operated in accordance with the present teachings. Stacking the memristor array depicted in FIG. 8 so as to construct a three dimensional memristor array is also possible.

In general and without limitation, the present teachings contemplate various memristors (i.e., memory resistors) that can be applied to any number of circuits and device types. Each memristor includes two electrically conductive electrodes and at least two different active materials disposed there between. The active materials can be provided as respective layers or as constituents of a granular material, or as a combination of homogonous layers and granular materials. At least one of the active materials is selected to exhibit increasing electrical resistance with increasing oxygen ion content, while another of the active materials is selected to exhibit decreasing electrical resistance with increasing oxygen ion content.

Programming (or control) circuitry is used to apply various programming voltages of respective magnitudes, polarities or durations to a particular memristor. The application of a programming voltage causes oxygen ions or oxygen vacancies migration between the respective active materials of the memristor. In general, direction of mobile dopant migration is determined by the polarity of the applied programming voltage.

In turn, the oxygen ion or vacancy distribution affects the electrical resistance of the memristor as a whole. In general, the magnitude of the electrical resistance shift is determined by the magnitude and duration of the applied programming voltage, while increase or decrease in electrical resistance is determined by polarity of the applied programming voltage. The electrical resistance value of the memristor is substantially non-volatile (i.e., constant) between programming events. This non-volatility is exhibited despite a total removal of electrical energy (i.e., bias signals, etc.) from the memristor.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus including a memristor, the memristor comprising:
   a first electrode;
   a second electrode spaced apart from the first electrode; and
   a first active material and a second active material in contact with the first active material disposed between the first and second electrodes, each of the active materials characterized by a respective change in electrical resistance in response to a change in oxygen ion content, the memristor characterized by a non-volatile electrical resistance that is adjustable by way of programming voltages, the first active material decreasing in electrical resistance with decreasing oxygen ion content, the second active material decreasing in electrical resistance with increasing oxygen ion content.

2. The apparatus according to claim 1, the first active material being titanium oxide or titanium dioxide, the second active material being manganese oxide or manganese monoxide.

3. The apparatus according to claim 1, the active materials being arranged as respective layers, a first one of the layers being in contact with the first electrode and a second one of the layers being in contact with the second electrode.

4. The apparatus according to claim 1, the active materials being respective constituents of a granular layer, the granular layer being in contact with the first and second electrodes.

5. The apparatus according to claim 1, at least the first electrode or the second electrode including at least copper, aluminum, platinum palladium, silver, gold, hafnium nitride, titanium nitride, tantalum nitride, or ruthenium oxide.

6. The apparatus according to claim 1, the first and second electrodes defined by respective portions of a first electrically conductive crossbar and a second electrically conductive crossbar.

7. The apparatus according to claim 1, the first and second electrodes respectively configured to electrically couple the memristor to another entity.

8. A memristor, comprising:
   a first electrode and a second electrode;
   a first material including oxygen ions disposed between the first and second electrodes, the first material characterized by decreasing electrical resistance with decreasing oxygen ion content; and
   a second material including oxygen ions disposed between the first and second electrodes, the second material characterized by decreasing electrical resistance with increasing oxygen ion content, the memristor characterized by a non-volatile electrical resistance that is adjustable over a range by way of programming voltages applied across the first and second electrodes.

9. The memristor according to claim 8, at least the first electrode or the second electrode including a metal.

10. The memristor according to claim 8, the first electrode and the second electrode defined by respective portions of a first electrical pathway and a second electrical pathway.

11. The memristor according to claim 10, the first electrical pathway and the second electrical pathway arranged as respective crossbars.

12. The memristor according to claim 8, the first material including titanium oxide or titanium dioxide, the second material including manganese oxide or manganese monoxide.

13. The memristor according to claim 8, the first material and the second material each defining one or more respective layers disposed between the first electrode and the second electrode.

14. The memristor according to claim 8, the first material and the second material being respective constituents of an aggregate disposed between the first electrode and the second electrode.

15. A method, comprising:
operating a memristor characterized by at least two active materials disposed between a first electrode and a second electrode, at least two of the active materials characterized by respectively opposite electrical resistance changes in response to decreasing oxygen ion content;
applying a programming voltage to the first and second electrodes so as to change a non-volatile electrical resistance of the memristor from a first value to a second value distinct from the first value; and
operating the memristor at the second non-volatile electrical resistance value.

16. The method according to claim 15, the memristor further characterized by a first layer of one of the plurality of active materials, the memristor further characterized by a second layer of one of the plurality of active materials different than that of the first layer.

17. The method according to claim 15, the memristor characterized by a layer of aggregate material including at least two different ones of the plurality of active materials.

* * * * *

UNITED STATES PATENT AND TRADEMARK OFFICE
CERTIFICATE OF CORRECTION

PATENT NO. : 8,385,101 B2
APPLICATION NO. : 12/847874
DATED : February 26, 2013
INVENTOR(S) : Jianhua Yang et al.

It is certified that error appears in the above-identified patent and that said Letters Patent is hereby corrected as shown below:

In the Claims:

In column 10, line 26, in Claim 5, delete "platinum" and insert -- platinum, --, therefor.

Signed and Sealed this
Thirteenth Day of August, 2013

Teresa Stanek Rea
*Acting Director of the United States Patent and Trademark Office*